United States Patent
Kim

(10) Patent No.: US 9,178,005 B2
(45) Date of Patent: Nov. 3, 2015

(54) ORGANIC LIGHT EMITTING DISPLAY AND METHOD OF MANUFACTURING THE SAME

(71) Applicant: SAMSUNG DISPLAY CO., LTD., Yongin, Gyeonggi-Do (KR)

(72) Inventor: Jeong-Hwan Kim, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/060,106

(22) Filed: Oct. 22, 2013

(65) Prior Publication Data
US 2014/0353607 A1    Dec. 4, 2014

(30) Foreign Application Priority Data
Jun. 4, 2013    (KR) .................. 10-2013-0064034

(51) Int. Cl.
*H01L 27/32*    (2006.01)

(52) U.S. Cl.
CPC .......... *H01L 27/326* (2013.01); *H01L 27/3248* (2013.01); *H01L 2227/323* (2013.01)

(58) Field of Classification Search
CPC ............................ H01L 27/32; H01L 51/50
USPC ............................................................ 257/40
See application file for complete search history.

(56) References Cited

U.S. PATENT DOCUMENTS

| 2004/0079945 A1* | 4/2004 | Weaver et al. .................. 257/71 |
| 2010/0061055 A1* | 3/2010 | Dabov et al. ............. 361/679.56 |
| 2010/0171685 A1* | 7/2010 | Kimura ........................... 345/76 |
| 2012/0153293 A1* | 6/2012 | Koyama et al. ................. 257/72 |
| 2012/0162053 A1 | 6/2012 | Lee et al. |
| 2012/0326174 A1 | 12/2012 | Park et al. |

FOREIGN PATENT DOCUMENTS

| KR | 10-2012-0072948 | 7/2012 |
| KR | 10-2012-0140474 | 12/2012 |
| KR | 10-2013-0011707 | 1/2013 |

* cited by examiner

*Primary Examiner* — Steven Loke
*Assistant Examiner* — Arash Majdi
(74) *Attorney, Agent, or Firm* — F. Chau & Associates, LLC

(57) ABSTRACT

An organic light emitting display includes a base substrate, a first transistor, an insulation layer having a first contact hole and a second contact hole, a first electrode, an organic layer, a second electrode and a pixel definition layer having a third contact hole. The second electrode may be connected to the first transistor through the second contact hole, and the second electrode may be connected to other devices. The second electrode may be connected to a switching device.

3 Claims, 22 Drawing Sheets

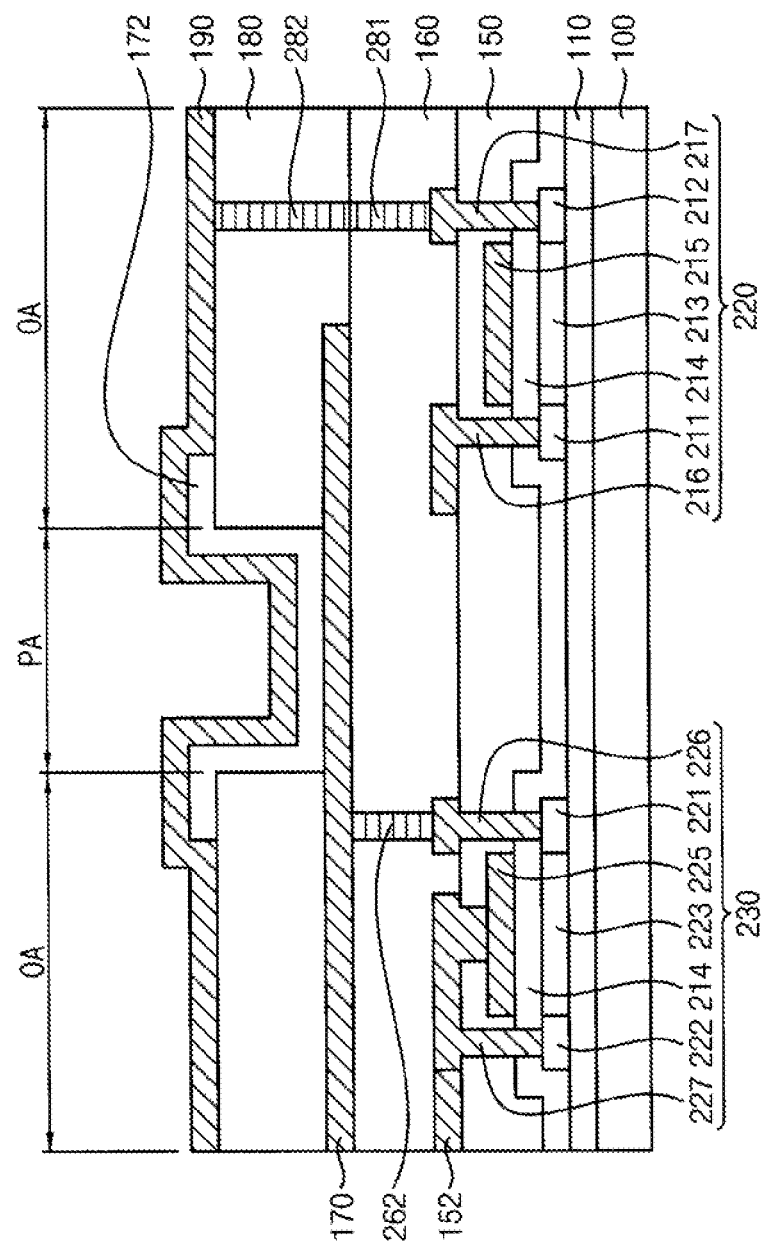

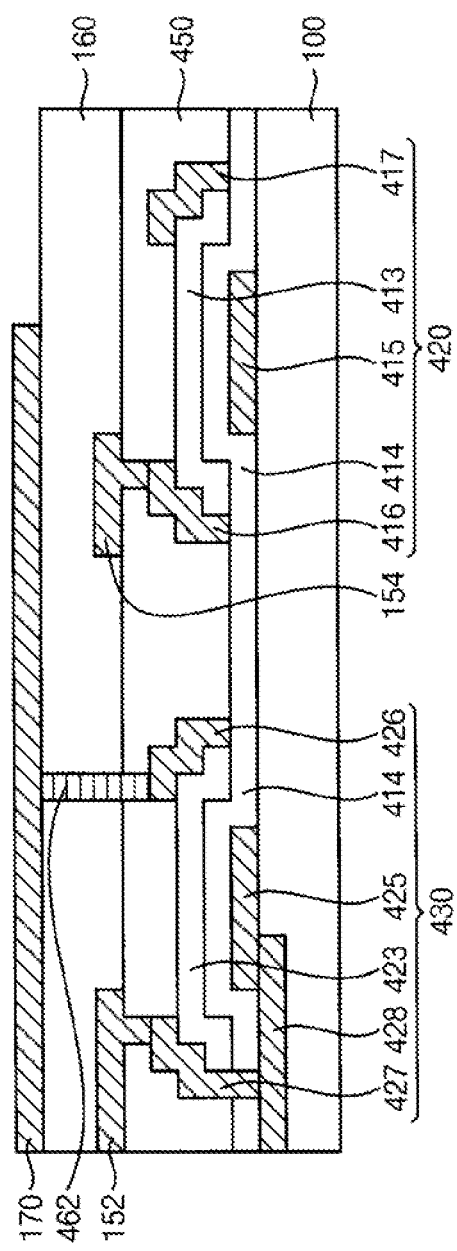

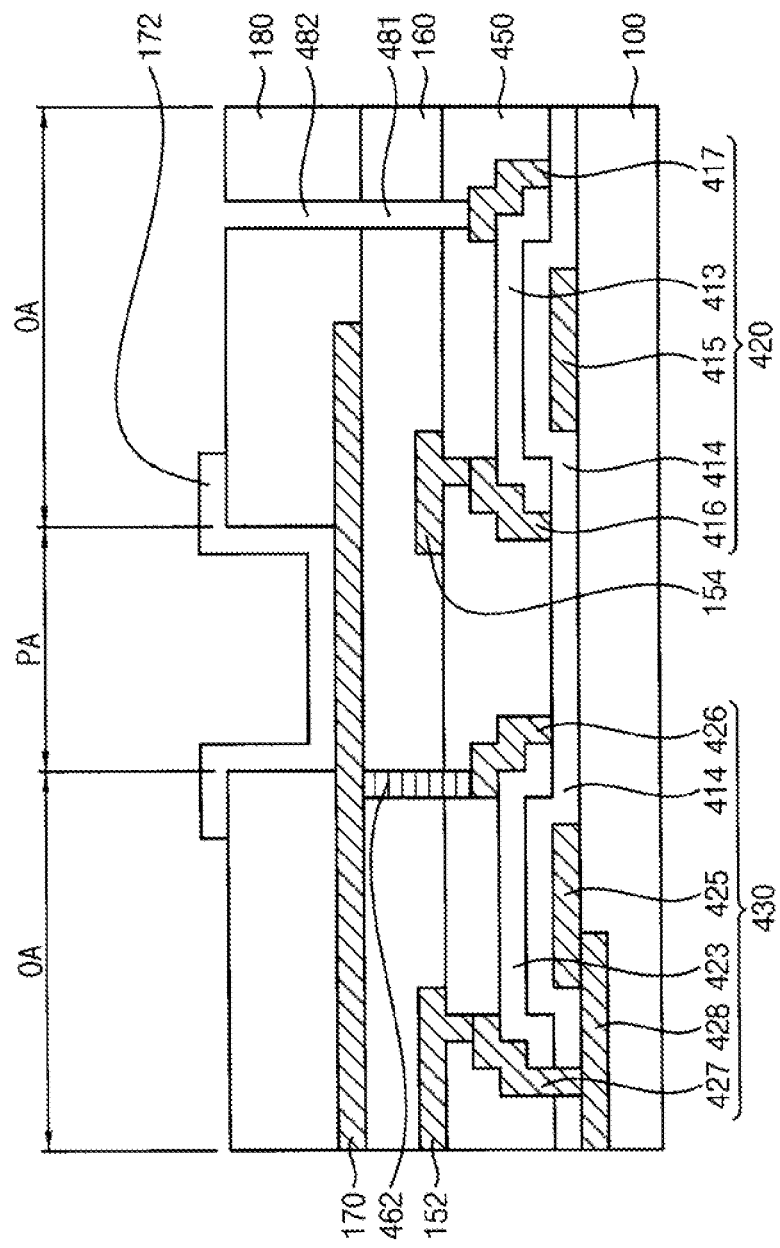

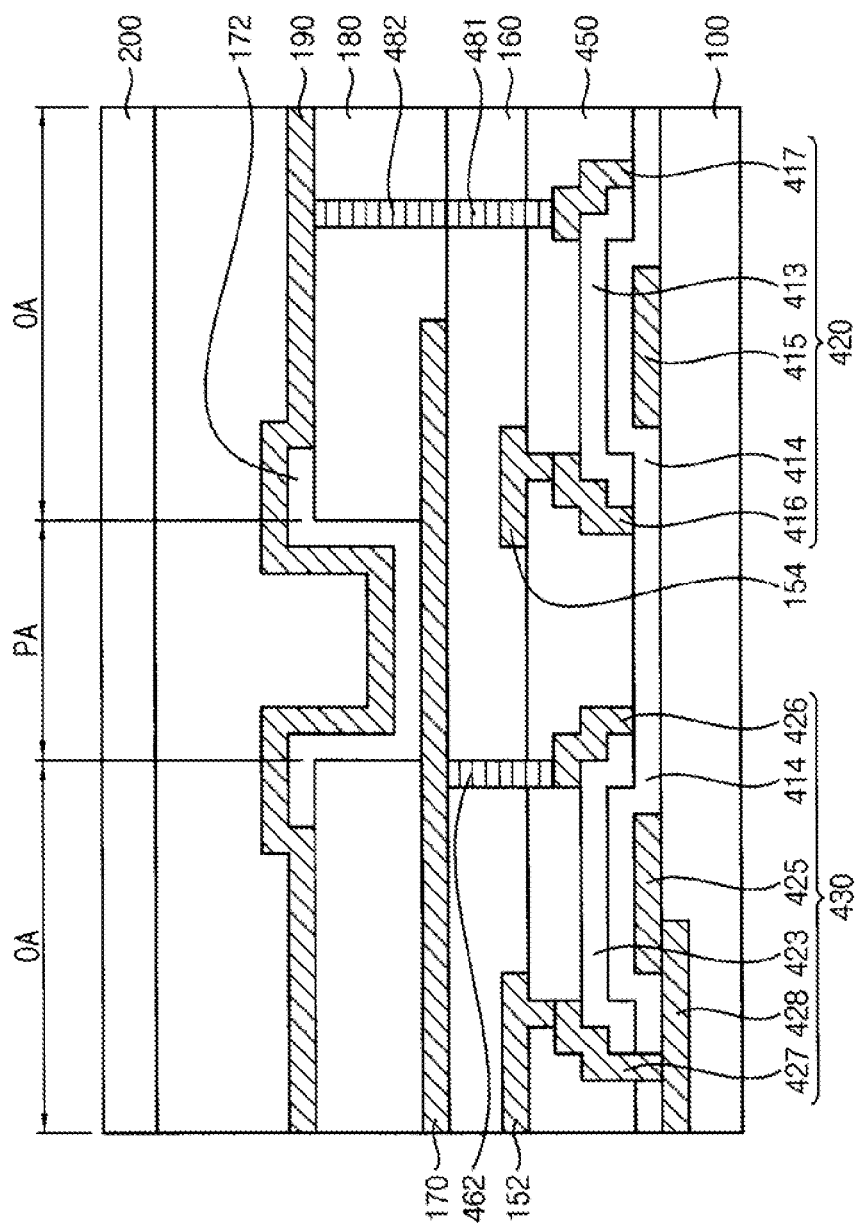

ORGANIC LIGHT EMITTING DISPLAY AND METHOD OF MANUFACTURING THE SAME

CROSS-REFERENCE TO RELATED APPLICATION(S)

This application claims priority under 35 USC §119 to Korean Patent Applications No. 10-2013-0064034, filed on Jun. 4, 2013 in the Korean Intellectual Property Office (KIPO), the disclosure of which is incorporated by reference herein in its entirety.

TECHNICAL FIELD

Exemplary embodiments relate to displays, and more specifically, to an organic light emitting display and a method of manufacturing the same.

DISCUSSION OF THE RELATED ART

An organic light emitting display includes organic light emitting diodes, switching devices for controlling the organic light emitting diodes, and driving devices for driving the switching devices. A cathode of each organic light emitting diode is directly connected to a ground. Thus, the organic light emitting diode is disposed at an edge of a pixel circuit, making it difficult to efficiently arrange the organic light emitting diodes in the display.

SUMMARY

According to an exemplary embodiment of the present invention, an organic light emitting display includes a base substrate, a first transistor, a driving member, an insulation layer, a first electrode, a pixel definition layer, an organic layer, and a second electrode. A driving member is disposed on the base substrate. A pixel definition layer has a third contact hole.

The first transistor includes a first source electrode, a first drain electrode and a first gate electrode. The insulation layer includes a first contact hole and a second contact hole, and the first electrode is electrically connected to the driving member through the first contact hole. The pixel definition layer includes the third contact hole, and the third contact hole is connected to the second contact hole disposed in the insulation layer. The second electrode is electrically connected to the first transistor through the third contact hole and the second contact hole.

In an exemplary embodiment of the present invention, the organic light emitting display may further include a driving device electrically connected to the first electrode through the first contact hole. The driving device is electrically connected to the driving member. The driving device is disposed on the base substrate.

In an exemplary embodiment of the present invention, the driving device may include a passive device.

In an exemplary embodiment of the present invention, the driving device may include an active device.

In an exemplary embodiment of the present invention, the driving device may include a second transistor having a second source electrode, a second gate electrode and a second drain electrode electrically connected to the second gate electrode.

In an exemplary embodiment of the present invention, each of the first transistor and the second transistor may include an N-type transistor.

In an exemplary embodiment of the present invention, each of the first transistor and the second transistor may include a P-type transistor.

In an exemplary embodiment of the present invention, the first transistor may include an N-type transistor, and the second transistor may include a P-type transistor.

In an exemplary embodiment of the present invention, the first transistor may include a P-type transistor, and the second transistor may include an N-type transistor.

According to an exemplary embodiment of the present invention, the organic light emitting display has a structure for the second electrode electrically connected to a device through the third contact hole disposed in the pixel definition layer and the second contact hole disposed in the insulation layer.

According to an exemplary embodiment of the present invention, a method of manufacturing an organic light emitting display includes forming a first transistor and a driving member on the base substrate. An insulation layer is formed on the first transistor and the driving member. A first contact hole is formed in the insulation layer. A first electrode is formed on the insulation layer. The first electrode is electrically connected to the driving member through the first contact hole. A pixel definition layer is formed on the first electrode. The pixel definition layer has an opening. A third contact hole is formed in the pixel definition layer. A second contact hole is formed in the insulation layer. The second contact hole is connected to the third contact hole. An organic layer is formed on the first electrode exposed by the opening in the pixel definition layer. A second electrode is electrically connected to the first transistor through the third contact hole and the second contact hole.

In an exemplary embodiment of the present invention, the method further includes forming a driving device electrically connected to the driving member on the base substrate. The first electrode may be connected to the driving device through the first contact hole.

In an exemplary embodiment of the present invention, the driving device may be formed substantially at the same time with the first transistor.

In an exemplary embodiment of the present invention, the driving device may be formed by forming a second transistor on the base substrate.

In an exemplary embodiment of the present invention, the first transistor and the second transistor may be formed. A buffer layer is formed. A first semiconductor layer and a second semiconductor layer are formed on the buffer layer. A gate insulation layer is formed on the first semiconductor layer and the second semiconductor layer. A first gate electrode and a second gate electrode are formed on the gate insulation layer. An insulating interlayer covers the first gate electrode, the second gate electrode, the first semiconductor layer and the second semiconductor layer. A first source electrode and a first drain electrode are electrically connected to the first semiconductor layer through the insulating interlayer and the gate insulation layer. A second drain electrode is electrically connected to the second semiconductor layer and the second gate electrode through the insulating interlayer and the gate insulation layer. A second source electrode is electrically connected to the second semiconductor layer through the insulating interlayer and the gate insulation layer.

In an exemplary embodiment of the present invention, the first transistor and the second transistor may be formed by forming a first gate electrode, a second electrode and an auxiliary electrode electrically connected to the second gate electrode, on the base substrate. A gate insulation layer is formed on the first gate electrode, the second gate electrode and the auxiliary electrode. A first semiconductor layer and a second semiconductor layer are formed on the gate insulation layer. A first source electrode and a first drain electrode are formed. The first source electrode is electrically connected to a portion of the first semiconductor layer, and the first drain electrode is electrically connected to the other portion of the first semiconductor layer. A second source electrode is electrically connected to a portion of the second semiconductor layer. A second drain electrode is electrically connected to the auxiliary electrode through the gate insulation layer and is electrically connected to a portion of the second semiconductor layer.

According to an exemplary embodiment of the present invention, an organic light emitting display comprises a base substrate. A switching element is disposed on the base substrate. A driving member is disposed on the base substrate. An insulation layer includes a first contact hole and a second contact hole. The insulation layer is disposed on the driving member. A first electrode is electrically connected to the driving member through the first contact hole. A pixel definition layer is disposed on the insulation layer. The pixel definition layer has a third contact hole. A second electrode is disposed on the pixel definition layer. The second electrode is electrically connected to the switching element through the third contact hole and the second contact hole. An organic layer is disposed between the first electrode and the second electrode.

BRIEF DESCRIPTION OF THE DRAWINGS

Illustrative, non-limiting exemplary embodiments will be more clearly understood from the following detailed description taken in conjunction with the accompanying drawings.

FIGS. 8A to 8H are cross sectional views illustrating a method of manufacturing an organic light emitting display of FIG. 4, according to an exemplary embodiment of the present invention;

FIGS. 10A to 10G are cross sectional views illustrating a method of manufacturing an organic light emitting display of FIG. 9, according to an exemplary embodiment of the present invention.

DETAILED DESCRIPTION OF THE EMBODIMENTS

Various exemplary embodiments will be described in more detail hereinafter with reference to the accompanying drawings. The present inventive concept may, however, be embodied in many different forms and should not be construed as limited to the exemplary embodiments set forth herein. Like numerals may refer to like or similar elements throughout the specification and the drawings.

It will be understood that when an element is referred to as being "on," "connected to," or "coupled to" another element, it can be directly on, connected or coupled to the other element or intervening elements may be present.

As used herein, the singular forms "a," "an" and "the" are intended to include the plural forms as well, unless the context clearly indicates otherwise.

Figure 1:
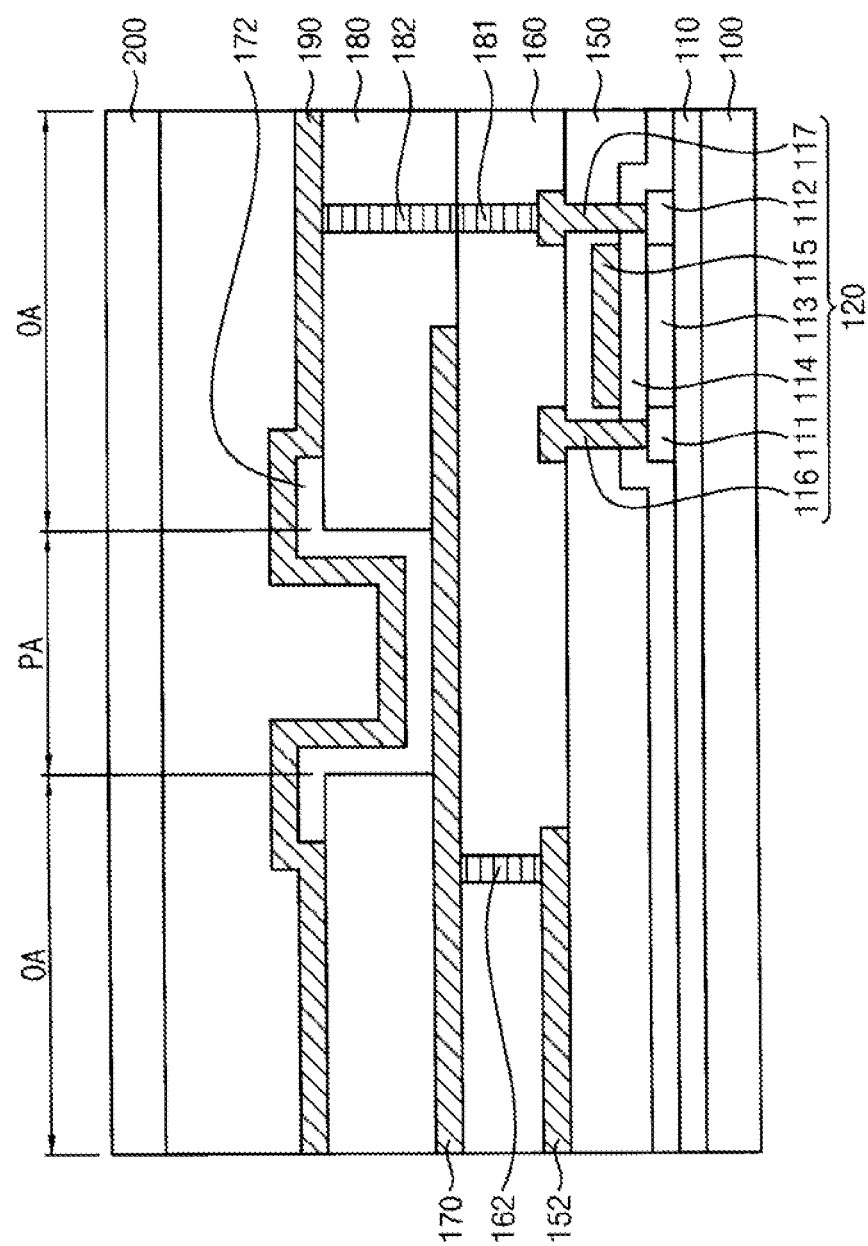
FIG. 1 is a cross sectional view illustrating an organic light emitting display in accordance with an exemplary embodiment of the present invention.
Figure 2:
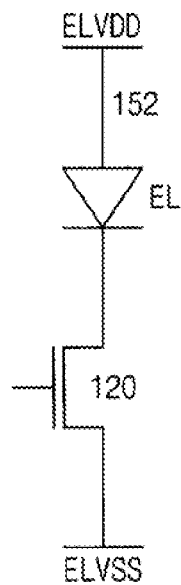
FIG. 2 is a circuit diagram illustrating an organic light emitting display of FIG. 1, according to an exemplary embodiment of the present invention.

FIG. 1 is a cross sectional view illustrating an organic light emitting display in accordance with an exemplary embodiment of the present invention. FIG. 2 is a circuit diagram illustrating an organic light emitting display of FIG. 1.

Referring to FIGS. 1 and 2, an organic light emitting display includes a base substrate 100, a first transistor 120, a driving member 152, an insulation layer 160 having a first contact hole 162 and a second contact hole 181, a first electrode 170, a pixel definition layer 180 having a third contact hole 182, an organic layer 172 having a light emitting layer, a second electrode 190, and a protective substrate 200.

The base substrate 100 supports the first transistor 120, the driving member 152 and the organic layer 172. The base substrate 100 may be an inorganic substrate including glass or poly silicon, and the base substrate 100 may be a plastic substrate including polyethylene terephthalate (PET), polyethylene naphthalate (PEN), polyimide, etc. Alternatively, the base substrate 100 may be used for a flexible display substrate including a conductive material such as a metal or polymer.

The first transistor 120 is disposed on the base substrate 100. The first transistor 120 includes a first gate electrode 115, a first source electrode 116, a first drain electrode 117, a gate insulation layer 114 and a first semiconductor layer 111, 112 and 113. The first transistor 120 functions as a switching device electrically connected to the second electrode 190 as illustrated in FIG. 1. The first transistor 120 may include an N-type transistor or a P-type transistor.

In an exemplary embodiment of the present invention, the first transistor 120 may be disposed on a buffer layer 110 disposed on the base substrate 100. The buffer layer 110 blocks impurities diffused from the base substrate 100. The buffer layer 110 increases a flatness of the base substrate 100. The buffer layer 110 releases stress while forming the first transistor 120 on the base substrate 100. The buffer layer 110 may include oxide, nitride or oxynitride. For example, the buffer layer 110 may have a mono-layered structure or a multi-layered structure including silicon oxide (SiOx), silicon nitride (SiNx) and/or silicon oxynitride (SiOxNy). In an exemplary embodiment of the present invention, the first transistor 120 may be directly disposed on the base substrate 100 without the buffer layer 110.

In an exemplary embodiment of the present invention, the first semiconductor layer 111, 112 and 113 is disposed on the buffer layer 110. The first semiconductor layer 111, 112 and 113 includes a first source 111, a first drain 112 and a first channel 113. The first semiconductor layer 111, 112 and 113 may include poly silicon, poly silicon having an impurity, amorphous silicon, amorphous silicon having an impurity, an oxide semiconductor, an oxide semiconductor having an impurity, and/or a combination thereof. The first source 111 and the first drain 112 may include an impurity area doped with impurities in accordance with the type of the first transistor 120. When the first transistor 120 is an N-type transistor, the first source 111 and the first drain 112 may include impurity areas doped with 5 group elements such as antimony (Sb), arsenic (As), phosphorus (P), etc. When the first transistor 120 is a P-type transistor, the first source 111 and the first drain 112 may include impurity areas doped with 3 group elements such as boron (B), gallium (Ga), indium (In), etc.

The gate insulation layer 114 may include an oxide or an organic insulating material. For example, the gate insulation layer 114 may include a silicon oxide, a hafnium oxide (HfOx), an aluminum oxide (AlOx), a zirconium oxide (ZrOx), a titanium oxide (TiOx), a tantalum oxide (TiOx), a benzo-cyclo-butene (BCB)-based resin, an acryl-based resin, etc. The gate insulation layer 114 may have a mono-layered structure or a multi-layered structure including an oxide or an organic insulating material.

The first gate electrode 115 is disposed on the gate insulation layer 114 adjacent to the first semiconductor layer 111, 112 and 113. For example, the first gate electrode 115 may be disposed on a portion of the gate insulation layer 114 in which the first channel 113 of the first semiconductor layer 111, 112 and 113 is located. The first gate electrode 115 may include a metal, a metal nitride, a conductive metal oxide, a transparent conductive material, etc. For example, the first gate electrode 115 may include aluminum (Al), aluminum alloy, an aluminum nitride (AlNx), silver (Ag), silver alloy, tungsten (W), tungsten nitride (WNx), copper (Cu), a copper alloy, nickel (Ni), chrome (Cr), molybdenum (Mo), a molybdenum alloy, titanium (Ti), titanium nitride (TiNx), platinum (Pt), tantalum (Ta), a tantalum nitride (TaNx), neodymium (Nd), scandium (Sc), a strontium ruthenium oxide (SrRuxOy), a zinc oxide (ZnOx), an indium tin oxide (ITO), a tin oxide (SnOx), an indium oxide (InOx), a gallium oxide (GaOx), an indium zinc oxide (IZO), etc. The first gate electrode 115 may have a mono-layered structure or a multi-layered structure including a metal, a metal nitride, a conductive metal oxide and/or a transparent conductive material.

In an exemplary embodiment of the present invention, a gate line electrically connected to the first gate electrode 115 is disposed on the gate insulation layer 114. A gate signal may be applied to the first gate electrode 115 through the gate line. The gate line may include substantially the same material as the first gate electrode 115. The gate line may have a mono-layered structure or a multi-layered structure including a metal, a metal nitride, a conductive oxide, and/or a transparent conductive material.

In an exemplary embodiment of the present invention, an insulating interlayer 150 covering the first gate electrode 115 may be disposed on the gate insulation layer 114. The insulating interlayer 150 may include an oxide, a nitride, an oxynitride, and/or an organic insulating material. For example, the insulating interlayer 150 may include a silicon oxide, a silicon nitride, a silicon oxynitride, an acryl-based resin, a polyimide-based resin, a siloxane-based resin, and/or a combination thereof. The insulating interlayer 150 may be disposed on the gate insulation layer 114 and may be disposed along the profile of the first gate electrode 115. The insulating interlayer 150 may have a uniform thickness. In an exemplary embodiment of the present invention, the insulating interlayer 150 covering a sufficient area of the first gate electrode 115 may have a flat surface.

Each of the first source electrode 116 and the first drain electrode 117 is electrically connected to the first source 111 and the first drain 112 through the insulating interlayer 150 and the gate insulation layer 114. One of the first source electrode 116 and the first drain electrode 117 may be electrically connected to the second electrode 190, and the other thereof may be electrically connected to a reference voltage supply ELVSS. For example, the reference voltage supply ELVSS may have a ground potential. Alternatively, one of the first source electrode 116 and the first drain electrode 117 may be electrically connected to other devices. The first source electrode 116 and the first drain electrode 117 may include a metal, a metal nitride, a conductive metal oxide, a transparent conductive material, etc. For example, the first source electrode 116 and the first drain electrode 117 may include aluminum, an aluminum alloy, an aluminum nitride, silver, a silver alloy, tungsten, a tungsten nitride, copper, a copper alloy, nickel, chrome, molybdenum, a molybdenum alloy, titanium, a titanium nitride, platinum, tantalum, a tantalum nitride, neodymium, scandium, a strontium ruthenium oxide, a zinc oxide, an indium tin oxide, a tin oxide, an indium oxide, a gallium oxide, an indium zinc oxide, and/or a combination thereof. The first source electrode 116 and the first drain electrode 117 may have a mono-layered structure or a multi-layered structure including a metal, a metal nitride, a conductive metal oxide, a transparent conductive material, etc.

Figure 3:
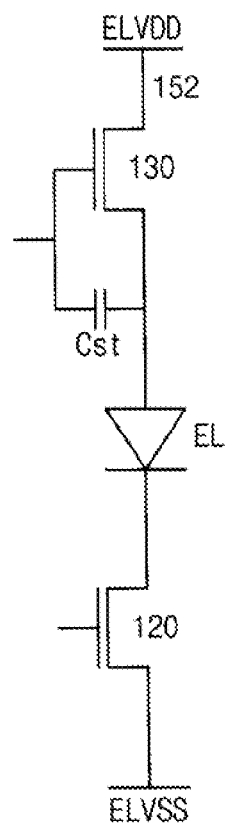
FIG. 3 is a circuit diagram illustrating an organic light emitting display in accordance with an exemplary embodiment of the present invention.

In an exemplary embodiment of the present invention, the driving member 152 is disposed on the base substrate 100 and is electrically connected to the first electrode 170 through the first contact hole 162. The driving member 152 may be directly connected to drive a voltage supply ELVDD, as illustrated in FIG. 2, and the driving member 152 may apply a voltage to the first electrode 170, and the organic layer 172 emits light by the applied voltage. In an exemplary embodiment of the present invention, the driving member 152 may be electrically connected to a driving device to control a drive current of an organic light emitting diode EL. For example, the driving member 152 may be electrically connected to a passive device such as a storage capacitor Cst, as illustrated in FIG. 3, and the storage capacitor Cst may maintain a drive voltage applied to the organic light emitting diode EL for a period of time after a driving switch turned off, and the storage capacitor Cst and the driving switch may control the drive current applied to the organic light emitting diode EL. Thus, the luminescence of the organic light emitting display can be controlled. As another example, the driving member 152 may be electrically connected to an active device. As another example, the driving member 152 may be electrically connected to a second transistor.

The driving member 152 may be a conductive line including aluminum, an aluminum alloy, an aluminum nitride, silver, a silver alloy, tungsten, a tungsten nitride, copper, a copper alloy, nickel, chrome, molybdenum, a molybdenum alloy, titanium, a titanium nitride, platinum, tantalum, a tantalum nitride, neodymium, scandium, a strontium ruthenium oxide, a zinc oxide, an indium tin oxide, a tin oxide, an indium oxide, a gallium oxide, an indium zinc oxide, and/or a combination thereof. The driving member 152 may have a mono-layered structure or a multi-layered structure including a metal, a metal nitride, a conductive metal oxide, a transparent conductive material, etc.

In an exemplary embodiment of the present invention, an insulation layer 160 covering the first transistor 120 and the driving member 152 may be disposed on the insulating interlayer 150. The insulation layer 160 may have a first contact hole 162 exposing a portion of the driving member 152 and a second contact hole 181 exposing a portion of the first source electrode 116 or a portion of the first drain electrode 117. The insulation layer 160 may include a transparent insulating material such as transparent plastic, a transparent resin, etc.

For example, the insulation layer 160 may include a benzo-cyclo-butene-based resin, an olefin-based resin, a polyimide-based resin, an aroyl-based resin, a polyvinyl-based resin, a siloxan-based resin, and/or a combination thereof. In an exemplary embodiment of the present invention, the insulation layer 160 may have a substantially flat surface formed by a planarization process. For example, the insulation layer 160 may be planarized by a chemical mechanical polishing (CMP) process, an etch-back process, etc. In an exemplary embodiment of the present invention, the insulation layer 160 may include a material having a self-planarizing property.

The first electrode 170, the pixel definition layer 180, the organic layer 172 and the second electrode 190 are disposed on the insulation layer 160. In an exemplary embodiment of the present invention, the first electrode 170 may be an anode providing holes to the organic layer 172, and the second electrode 190 may be a cathode providing electrons to the organic layer 172. In an exemplary embodiment of the present invention, the first electrode 170 and the second electrode 190 may exchange their polarities with each other. For example, the first electrode 170 may be a cathode, and the second electrode 190 may be an anode.

In an exemplary embodiment of the present invention, when the organic light emitting display has a top emission type, the first electrode 170 may be a reflective electrode having a reflectivity. In an exemplary embodiment of the present invention, the second electrode 190 may be a transmitting electrode having a transmissive or a transflective electrode having a semi translucent property. In an exemplary embodiment of the present invention, when the organic light emitting display has a bottom emission type, the first electrode 170 may be a transmitting electrode or transflective electrode, and the second electrode 190 may be a reflective electrode. As used herein, the term "reflectivity" means that a reflectance by incident light is about 70% or more and about 100% or less. The term "semitranslucent" and "transflective" mean that a reflectance by incident light is about 30% or more and about 70% or less. Alternatively, the term "transmissive" means that a reflectance by incident light is about 30% or less.

When the first electrode 170 is a reflective electrode in accordance with an exemplary embodiment of the present invention, the first electrode 170 may include a metal, a metal alloy, etc., which have a high reflectance. For example, the first electrode 170 may include aluminum, silver, platinum, gold (Au), chrome, tungsten, molybdenum, titanium, palladium (Pd), an alloy thereof, and/or a combination thereof. For example, the alloy may be a silver-copper-gold (Ag—Cu—Au: ACA) alloy, a silver-protactinium-copper (Ag—Pa—Cu: APC) alloy, etc. According to an exemplary embodiment of the present invention, the first electrode 170 may have a mono-layered structure or a multi-layered structure including a metal and/or a metal alloy.

When the second electrode 190 is a transflective electrode in accordance with an exemplary embodiment of the present invention, the second electrode 190 may include a thin metal layer. In an exemplary embodiment of the present invention, the second electrode 190 may have both a reflectance and a transmittance. When the second electrode 190 is relatively thick, the luminescence of the organic light emitting display may be decreased. Thus, the second electrode 190 may be relatively thin. For example, the second electrode 190 may have a thickness of about 30 nm or less. For example, the second electrode 190 may have a thickness of about 20 nm or less. For example, the second electrode 190 may include aluminum, silver, platinum, gold, chrome, tungsten, molybdenum, titanium, palladium, an alloy thereof, and/or a combination thereof. In an exemplary embodiment of the present invention, the second electrode 190 may include a transparent conductive material. For example, the second electrode 190 may include an indium zinc oxide, an indium tin oxide, a gallium tin oxide, a zinc oxide (ZnOx), a gallium oxide, a tin oxide, an indium oxide, and/or a combination thereof. In an exemplary embodiment of the present invention, the second electrode 190 may have a multi-layered structure including a plurality of transmitting layers or a plurality of transflective layers.

The first electrode 170 is electrically connected to the driving member 152 through the first contact hole 162 disposed in the insulation layer 160. In an exemplary embodiment of the present invention, the first electrode 170 may be directly connected to the driving member 152. In an exemplary embodiment of the present invention, a contact, a plug, and a pad may be disposed in the first contact hole 162. In an exemplary embodiment of the present invention, the first electrode 170 may be electrically connected to the driving member 152 by the contact, the plug, or the pad.

The pixel definition layer 180 is disposed on the insulation layer 160 and the first electrode 170, and includes an opening. The opening exposes a portion of the first electrode 170, and the organic layer 172 and the second electrode 190 are disposed on the portion of the first electrode 170 exposed by the opening. The first electrode 170, the organic layer 172 and the second electrode 190 constitute a pixel, in the opening. Thus, the area of the opening is defined as a pixel area PA, and another area is defined as non-pixel area OA. The pixel definition layer 180 may include a commercial polymer (e.g. poly methyl methacrylate (PMMA), or polystyrene (PS)), a polymer derivative having phenol group, an acryl-based polymer, an imid-based polymer, an aryl-ether-based polymer, an amide-based polymer, a fluorine-based polymer, a p-xylene-based polymer, a vinyl-alcohol-based polymer, and/or a combination thereof. The pixel definition layer 180 may also include an inorganic insulating material, and the pixel definition layer 180 may have a multi-layered structure in which the organic layer and the inorganic layer are alternately formed. The pixel definition layer 180 may include a third contact hole 182, and the third contact hole 182 is connected to the second contact hole 181 disposed in the insulation layer 160. Thus, the second electrode 190 can be electrically connected to the first transistor 120 through the third contact hole 182 and the second contact hole 181.

The organic layer 172 includes a light emitting layer, and is disposed on the portion of the first electrode 170 exposed by the opening of the pixel definition layer 180, in the pixel area. The organic layer 172 may be also disposed on the pixel definition layer 180, in the non-pixel area OA. The light emitting layer emits light by accepting electrons and holes provided from the first electrode 170 and the second electrode 190. The electrons and holes are combined to form excitons. The excitons emit light having a predetermined wavelength when shifting from an excited state to a stable state in the light emitting layer. The organic layer 172 may have a multi-layered structure including an electron injection layer, an electron transport layer, a hole transport layer and a hole injection layer to increase luminous efficiency and to decrease a drive voltage. The light emitting layer may include a host material such as tris(8-hydroxyquinolinato)aluminum (Alq3), 9,10-Di(naphth-2-yflanthracene (ADN), 1,3-bis(carbazol-9-yl)benzene (mCP), 1,3,5-tris(carbazol-9-yl)benene (tCP), etc. and may also include a dopant material such as tris[1-phenylyisoquinoline-$C^2$,N]iridium(III) (Ir(piq)3), tris [2-phenylypyridinato-$C^2$,N]iridium(III), iridium(III)bis[4,6-difluorophenly-pyridinato-N,$C^2$] (F2Irpic), etc. The light emitting layer may emit various types of light such as red, green, blue light according to the type of the dopant material. When the second electrode 190 is a cathode, the electron injection layer may include a lithium fluoride (LiF), a sodium chloride (NaCl), a barium fluoride (BaF), a caesium fluoride (CsF), a lithium oxide ($Li_2O$), an aluminum oxide ($Al_2O_3$), a barium oxide (BaO), a fullerene ($C_{60}$), and/or a mixture thereof for easy injection of electrons provided by the second electrode 190. The electron transport layer can control electron mobility and injection properties, and the electron transport layer may include a metal complex of a phenanthroline derivative, an anthracene derivative, a pyrimidine derivative, a pyridine derivative, and/or a benzoquinoline derivative. When the first electrode 170 is an anode, the hole injection layer can easily inject holes provided from the first electrode 170, and the hole injection layer may include 4,4',4"-tris(3-methylphenylamino)triphenylaimine (m-MTDATA), 3,5-tris[4-(3-methylphenylamino)phenyl]benzene (m-MTDATB), etc. The hole transport layer can control hole injection properties, and may include N,N'-diphenyl-N,N'-bis(1-naphthyl)-(1,1'-biphenyl)-4,4'-diamine (NPB), a N,N'-di(naphthalene-1-yl)-N,N'-diphenyl benzidine (α-NPD), a N,N-bis(3-methylphenyl)-N,N-diphenyl-[1,1-biphenyl]-4,4-diamine (TPD), etc.

The second electrode 190 may be disposed on the organic layer 172 in the pixel area PA, and may be disposed on the pixel definition layer in the non-pixel area OA. The second electrode 190 may be electrically connected to the first transistor 120 through the third contact hole 182 in the pixel definition layer 180 and the second contact hole 181 in the insulation layer 160. In an exemplary embodiment of the present invention, the second electrode 190 may be directly connected to the first transistor 120. In an exemplary embodiment of the present invention, the second electrode 190 may be electrically connected to the first transistor 120 through a contact, a plug, or a pad which covers the third contact hole 182 and the second contact hole 181.

The protective substrate 200 is disposed on the second electrode 190, to protect the organic layer 172, the first transistor 120, the first electrode 170 and the second electrode 190 from an external environment. The protective substrate 200 may have chemical stability to prevent the organic layer 172 from external moisture and gas, and the protective substrate may have an increased transparency of light emitted by the organic layer 172. Thus, the protective substrate 200 may include glass, a transparent metal film, an organic insulation layer, an inorganic insulation layer, etc.

According to an exemplary embodiment of the present invention, the organic light emitting display includes the third contact hole 182 in the pixel definition layer 180, and the second contact hole 181 in the insulation layer 160. The second electrode 190 may be perpendicularly connected to the first transistor 120 through the third contact hole 182 and the second contact hole 181. Thus, devices of the organic light emitting display may have various arrangements. For example, as illustrated in FIG. 2, the first transistor 120 may be positioned ahead of the organic light emitting diode EL and may control the organic light emitting diode EL. Other devices may be added. The pixel may be formed more compactly, and the resolution of the organic light emitting display is increased.

Figure 4:
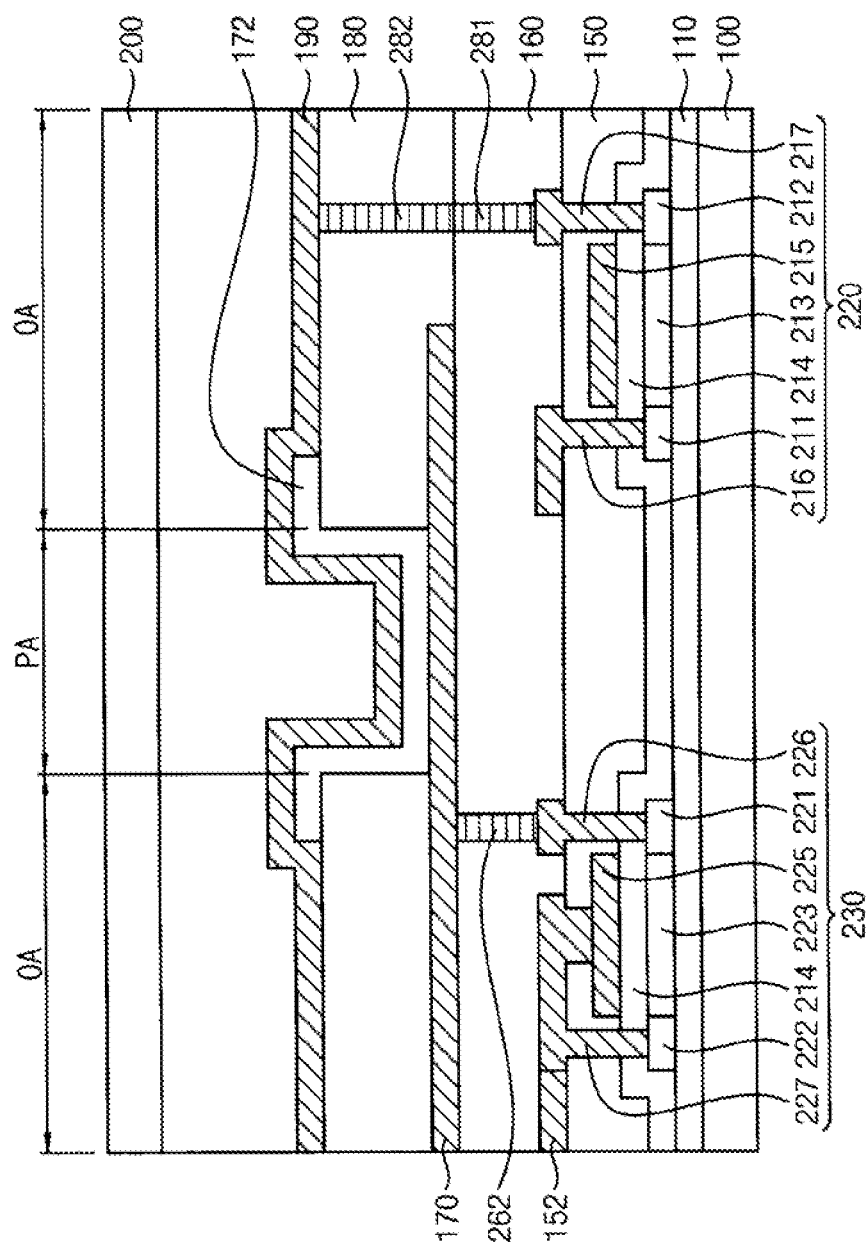
FIG. 4 is a cross sectional view illustrating an organic light emitting display in accordance with an exemplary embodiment of the present invention.
Figure 5:
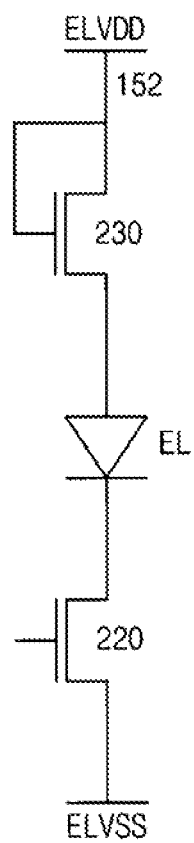
FIG. 5 is a circuit diagram illustrating an organic light emitting display of FIG. 4, according to an exemplary embodiment of the present invention.

FIG. 4 is a cross sectional view illustrating an organic light emitting display in accordance with an exemplary embodiment of the present invention. FIG. 5 is a circuit diagram illustrating an organic light emitting display of FIG. 4, according to an exemplary embodiment of the present invention.

Referring to FIGS. 4 and 5, the organic light emitting display includes a base substrate 100 a first transistor 220, a second transistor 230, a insulation layer 160 having a first contact hole 262 and a second contact hole 281, a first electrode 170, a pixel definition layer 180 having a third contact hole 282, a organic layer 172 having a light emitting layer, a second electrode 190, and protective substrate 200. In an exemplary embodiment of the present invention, the other elements than the second transistor 230, the first contact hole 262, the second contact hole 281 and the third contact hole 282, may be substantially the same as corresponding elements of the organic light emitting display described above in connection with FIGS. 1 and 2.

Figure 6:
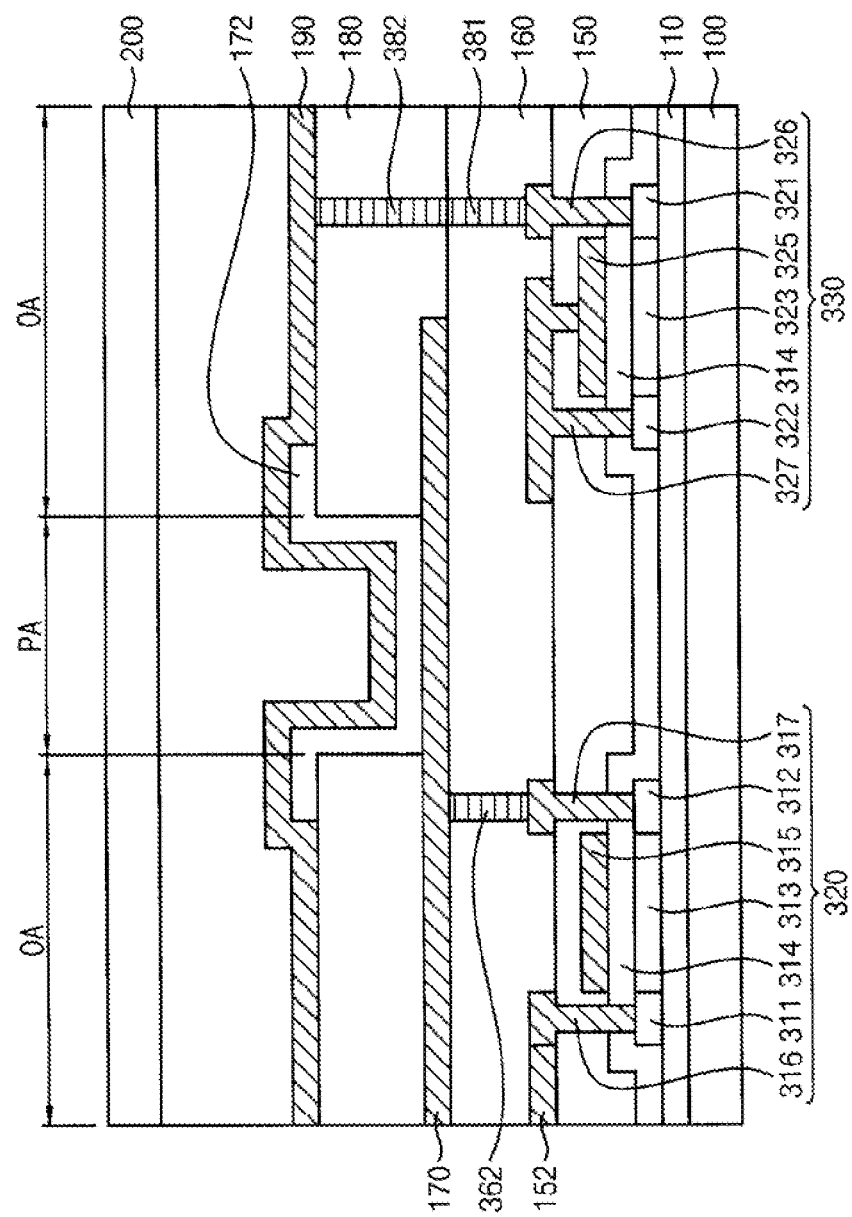
FIG. 6 is a cross sectional view illustrating an organic light emitting display in accordance with an exemplary embodiment of the present invention.
Figure 7:
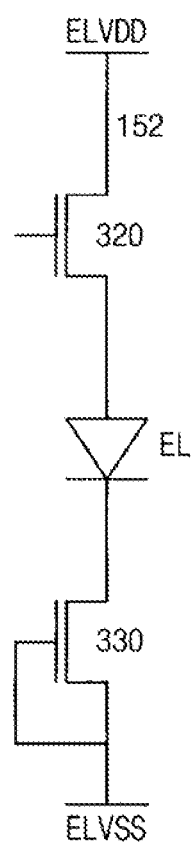
FIG. 7 is a circuit diagram illustrating an organic light emitting display of FIG. 6, according to an exemplary embodiment of the present invention.

In an exemplary embodiment of the present invention, as illustrated in FIGS. 4 and 5, the first transistor 220 and the second transistor 230 may be N-type-NMOS transistors. The N-type transistors include the n-channels 213 and 223 formed by electrons to be induced by the positive voltage applied to the gate electrode 215 and 225. In an exemplary embodiment of the present invention, as illustrated in FIGS. 6 and 7, the first transistor 220 and the second transistor 230 may be P-type PMOS transistors. In an exemplary embodiment of the present invention, the first transistor 220 and the second transistor 230 may be a N-type CMOS transistor and a P-type CMOS transistor.

The first transistor 220 is disposed on the base substrate 100, and may include a first gate electrode 215, a first source electrode 216, a first drain electrode 217, a gate insulation layer 214, and a first semiconductor layer 211, 212 and 213. In an exemplary embodiment of the present invention, the first transistor 220 may be an N-type transistor. In an exemplary embodiment of the present invention, a first source 211 and the first drain 212 of the first semiconductor layer 211, 212 and 213 may include an impurity area doped with a 5 group elements such as antimony, arsenic, phosphorus, etc. As illustrated in FIG. 4, the first drain electrode 217 may be electrically connected to the second electrode 190 through the second contact hole 281 and the third contact hole 282, and the first source electrode 216 may be electrically connected to a reference voltage supply ELVSS. Thus, the first transistor 220 functions as a switching device controlling the organic light emitting diode EL. All of the elements of the first transistor 220 may be substantially the same as their corresponding elements of the organic light emitting display described above in connection with FIGS. 1 and 2.

The second transistor 230 is disposed on the base substrate 100, and may include a second semiconductor layer 221, 222 and 223, the gate insulation layer 214, a second gate electrode 225, a second source electrode 226, and a second drain electrode 227.

In an exemplary embodiment of the present invention, the second transistor 230 may disposed on a buffer layer 110 disposed on the base substrate 100, and the buffer layer 110 blocks impurities diffused from base substrate 100, and the buffer layer 110 increases a flatness of the base substrate 100. The buffer layer 110 may be omitted, alternatively. The buffer layer 110 is substantially the same as the buffer layer 110 of the organic light emitting display described in connection with FIGS. 1 and 2.

The second semiconductor layer 221, 222 and 223 is disposed on the buffer layer 110, and may include a second source 221, a second drain 222 and a second channel 223. In an exemplary embodiment of the present invention, the second transistor 230 may be an N-type transistor. Thus, the second source 221 and the second drain 222 may include an impurity area doped with a 5 group element such as antimony, arsenic, phosphorus, etc. The second semiconductor layer 221, 222 and 223 is substantially the same as the first semiconductor layer 211, 212 and 213 in the first transistor 220.

The second gate electrode 225 may be disposed on the gate insulation layer 214 adjacent to the second semiconductor layer 221, 222 and 223. The second gate electrode 225 is substantially the same as the first gate electrode in the first transistor 220.

Each of the second source electrode 226 and the second drain electrode 227 may be connected to the second source 221 and the second drain 222, through the insulating interlayer 150 and the gate insulation layer 214. In an exemplary embodiment of the present invention, the second drain electrode 227 is electrically connected both to the second gate electrode 225 and driving member 152, through the insulating interlayer 150. Thus, the second transistor 230 functions as a driving device. The second source electrode 226 is electrically connected to the first electrode 170 through the first contact hole 262. Thus, this structure may be substantially equivalent to the circuit diagram of FIG. 5. Referring to FIG. 5, the second gate electrode 225 is electrically connected to the second drain electrode 226. Therefore, the second transistor 230 functions as a capacitor having as the gate insulation layer 214 as a cap insulator. Thus, the second transistor 230 may be similar to storage capacitor Cst of the circuit diagram illustrated in FIG. 3. For example, the second transistor 230 may control the luminescence of the display by controlling the current flow of the organic light emitting diode EL.

Each of the second source electrode 226 and the second drain electrode 227 may include a metal, a metal nitride, a conductive metal oxide, a transparent conductive material, etc. The second source electrode 226 and the second drain electrode 227 are substantially the same as the first source electrode 216 and the first drain electrode 217 in the first transistor 220.

The insulation layer 160 covering the first transistor 220 and the second transistor 230 may be disposed on the insulating interlayer 150. The insulation layer 160 may include a first contact hole 262 exposing a portion of the second source electrode 226, and a second contact hole 281 exposing a portion of the first drain electrode 217. The insulation layer 160 is substantially the same as the insulation layer 160 of the organic light emitting display described above in connection with FIGS. 1 and 2.

The first electrode 170 may be disposed on the insulation layer 160, and may be electrically connected to the second transistor 230 through the first contact hole 262. In an exemplary embodiment of the present invention, the first electrode 170 may be directly connected to the second transistor 230. In an exemplary embodiment of the present invention, a contact, a plug, or a pad may be disposed in the first contact hole 262. In an exemplary embodiment of the present invention, the first electrode 170 may be electrically connected to the second transistor 230 by the contact, the plug, or the pad. The first electrode 170 is substantially the same as the first electrode 170 of the organic light emitting display described above in connection with FIGS. 1 and 2.

The pixel definition layer 180 may be disposed on the first electrode 170 and the insulation layer 160, and the pixel definition layer 180 may include an opening exposing a portion of the first electrode 170, and the pixel definition layer 180 may include a third contact hole 282 connected to the second contact hole 281. The pixel definition layer 180 is substantially the same as the pixel definition layer 180 of the organic light emitting display described above in connection with FIGS. 1 and 2.

The second electrode 190 may be disposed on the organic layer 172 in the pixel area PA, and may be disposed on the pixel definition layer 180 in the non-pixel area OA. The second electrode 190 may be electrically connected to the first transistor 220 through the third contact hole 282 and the second contact hole 281. In an exemplary embodiment of the present invention, the second electrode 190 may be directly connected to the first transistor 220. In an exemplary embodiment of the present invention, a contact, a plug, or a pad may be disposed in the third contact hole 282 and the second contact hole 281. In an exemplary embodiment of the present invention, the second electrode 190 may be electrically connected to the first transistor 220 by the contact, the plug, or the pad. The second electrode 190 is substantially the same as the second electrode 190 of the organic light emitting display described above in connection with FIGS. 1 and 2.

According to an exemplary embodiment of the present invention, the organic light emitting display includes the first contact hole 262, the second contact hole 281 and the third contact hole 282, and enables the organic light emitting diode EL to be disposed between the first transistor 220 and the second transistor 230. Thus, the various circuit designs are possible, and the luminescence of the organic light emitting display may be controlled, because the second transistor 230 functions as storage capacitor Cst.

FIG. 6 is a cross sectional view illustrating an organic light emitting display in accordance with an exemplary embodiment of the present invention. FIG. 7 is a circuit diagram illustrating an organic light emitting display of FIG. 6, according to an exemplary embodiment of the present invention.

Referring to FIGS. 6 and 7, the organic light emitting display may include a base substrate 100, a first transistor 320, a second transistor 330, a insulation layer 160 having a first contact hole 362 and a second contact hole 381, a first electrode 170, a pixel definition layer 180 having a third contact hole 382, an organic layer 172 having a light emitting layer, a second electrode 190, and a protective substrate 200. In an exemplary embodiment of the present invention, the other elements than the first transistor 320 and the second transistor 330 are substantially the same as their corresponding elements of the organic light emitting display described above in connection with FIGS. 5 and 6.

In an exemplary embodiment of the present invention, as illustrated in FIGS. 6 and 7, the first transistor 320 and the second transistor 330 may be P-type PMOS transistors. The P-type transistors include the p-channels 313 and 323 formed by holes to be induced by the negative voltage applied to the gate electrode 315 and 325.

The first transistor 320 is disposed on the base substrate 100, and may include a first gate electrode 315, a first source electrode 316, a first drain electrode 317, a gate insulation layer 314 and a first semiconductor layer 311, 312 and 313. In an exemplary embodiment of the present invention, as the first transistor 320 is a P-type transistor, a first source 311 and a first drain 312 in the first semiconductor layer 311, 312 and 313 include an impurity area doped with 3 group elements, such as boron, gallium, indium, etc. As illustrated in FIG. 6, the first drain electrode 317 is electrically connected to the first electrode 170 through the first contact hole 362, and the first source electrode 316 is electrically connected to the driving member 152. Thus, as illustrated in FIG. 7, the first transistor 320 functions as a switching device controlling the organic light emitting diode EL upon connection to the anode of the organic light emitting diode EL. All of the elements of the first transistor 320 are substantially the same as their corresponding elements of the first transistor 220 in the organic light emitting display described above in connection with FIGS. 5 and 6.

The second transistor 330 is disposed on the base substrate 100, and may include a second gate electrode 325, a second source electrode 326, a second drain electrode 327, the gate insulation layer 314 and a second semiconductor layer 321, 322 and 323. In an exemplary embodiment of the present invention, as the second transistor 330 is a P-type transistor, a second source 321 and a second drain 322 in the second semiconductor layer 321, 322 and 323 include an impurity area doped with 3 group elements, such as boron, gallium, indium, etc. As illustrated in FIG. 6, the second electrode 326 is electrically connected to the second electrode 190 through the second contact hole 381 and the third contact hole 382, and the second drain electrode 327 is electrically connected to a reference voltage supply ELVSS and the second gate electrode 325. Thus, as illustrated in a circuit diagram of FIG. 7, the second transistor 330 functions as a driving device controlling a driving current upon connection to the cathode of organic light emitting diode EL. All of the elements of the second transistor 330 are substantially the same as their corresponding elements of the second transistor 230 described above in connection with FIGS. 5 and 6.

FIGS. 8A to 8H are cross sectional views illustrating a method of manufacturing an organic light emitting display of FIG. 4, according to an exemplary embodiment of the present invention. Although FIGS. 8A to 8H show only one method of manufacturing of an organic light emitting display having a NOMS structure illustrated in FIG. 4, an organic light emitting display as described above in connection with FIGS. 1 and 6 might be also manufactured by a method obtained by, e.g., omitting and adding the steps.

Figure 8A:

Referring to FIG. 8A, a buffer layer 110 to form a first transistor 220 and a second transistor 230 may be formed on a base substrate 100. The base substrate 100 may be formed of a transparent insulating material, the buffer layer 110 may be formed of an oxide, a nitride, an oxynitride, an organic insulating material, etc. The buffer layer 110 may be formed on the base substrate 100 by a chemical vapor deposition (CVD) method, a plasma-enhanced CVD (PECVD) method, a high-density-plasma CVD (HDP CVD) method, a spin coating method, a thermal oxidation method, a printing method, etc.

Figure 8B:
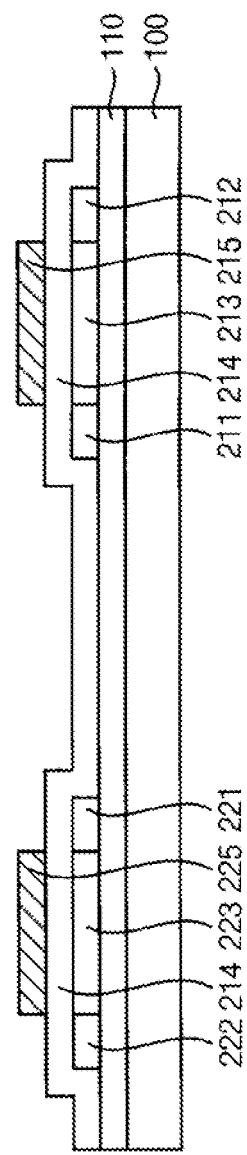

Referring to FIG. 8B, a first semiconductor layer 211, 212 and 213, a second semiconductor layer 221, 222 and 223, a gate insulation layer 214, a first gate electrode 215, and a second gate electrode 225 may be formed on the buffer layer 110.

The first semiconductor layer 211, 212 and 213 and the second semiconductor layer 221, 222 and 223 may be formed of silicon by, e.g., CVD, PECVD, HDP CVD, a spin coating method, a printing method, etc.

The gate insulation layer 214 may be uniformly formed along the profile of the first semiconductor layer 211, 212 and 213 and the second semiconductor layer 221, 222 and 223. The gate insulation layer 214 may be formed by a sputtering method, CVD, atomic layer deposition (ALD), HDP CVD, a spin coating method, a printing method, etc.

The first gate electrode 215 may be formed on a portion of gate insulation layer 214 in which the first semiconductor layer 211, 212, and 213 is located. The second gate electrode 225 may be formed on a portion of the gate insulation layer 214 in which the second semiconductor layer 221, 222 and 223 is located. The gate electrode 215 and 225 may be formed of a metal, a metal nitride, a conductive metal oxide, a transparent conductive material, etc. The gate electrode 215 and 225 may be formed by a sputtering method, CVD, ALD, a spin coating method, a vacuum deposition, pulsed laser deposition (PLD), a printing method, etc.

A first source 211, a first drain 212, a second source 221 and a second drain 222 may be formed by doping impurities into the semiconductor layer 211, 212, 213, 221, 222 and 223 using the gate electrodes 215 and 225 as masks. For example, N-type sources 211 and 221 and N-type drains 212 and 222 may be formed by doping 5 group elements, such as antimony, arsenic, phosphorus, etc. In an exemplary embodiment of the present invention, the transistors 220 and 230 are N-type transistors. As another example, P-type sources 211 and 221 and P-type drains 212 and 222 may be formed by doping 3 group elements, such as boron, gallium, indium, etc. In an exemplary embodiment of the present invention, the transistors 220 and 230 are P-type transistors. After doping impurities, each center of the semiconductor layer 211, 212, 213, 221, 222 and 223 may be formed as a first channel 213 and a second channel 223. For example, the doping is conducted by an ion implantation method. In an exemplary embodiment of the present invention, a gate line may be formed on a portion of the gate insulation layer 214 while the gate electrode 215 and 225 are formed. The gate line may be extended on the gate insulation layer 214, and may be connected to the gate electrode 215 and 225.

Figure 8C:
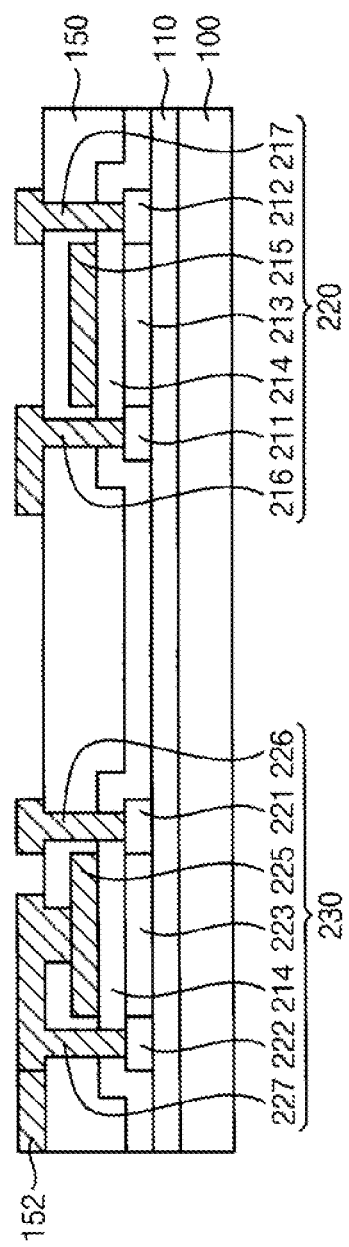

Referring to FIG. 8C, the insulating interlayer 150 covering the gate electrodes 215 and 225 may be formed on the gate insulation layer 214. The insulating interlayer 150 may be formed of an oxide, a nitride, an oxynitride, an organic insulating material, etc. The insulating interlayer 150 may be formed by a sputtering method, CVD, PECVD, ALD, a spin coating method, a vacuum deposition, PLD, a printing method, etc.

Contact holes exposing a portion of the first source 211, a portion of the first drain 212, a portion of the second source 221, a portion of the second drain 222 and a portion of the second gate electrode 225 may be formed by partially etching the insulating interlayer 150. A first source electrode 216 connected to the first source 211, a first drain electrode 217 connected to the first drain 212 and a second source electrode 226 connected to the second source 221 may be formed on the insulating interlayer 150, filling the contact holes. A second drain electrode 227 connected to the second drain 222 and the second gate electrode 225 may also be formed on the insulating interlayer 150, filling the contact holes. The source electrodes 216 and 226 and the drain electrodes 217 and 227 may be formed of a metal, a metal nitride, a conductive metal oxide, a transparent conductive material, etc, by, e.g., a sputtering method, CVD, PECVD, ALD, a spin coating method, a vacuum deposition, PLD, a printing method, etc. According to an exemplary embodiment of the present invention, a reference voltage supply connected to the first source electrode 216 may be further formed in a portion of insulating interlayer 150, a driving member 152 connected to the second drain electrode 227 may be further formed in a portion of insulating interlayer 150. In an exemplary embodiment of the present invention, when the first transistor 220 and the second transistor 230 are P-type transistors, the driving member 152 connected to the first source electrode 216 may be formed. The driving member 152 and the reference voltage supply may be formed by substantially the same method as the method of forming the source electrodes 216 and 226 and the drain electrodes 217 and 227.

Figure 8D:
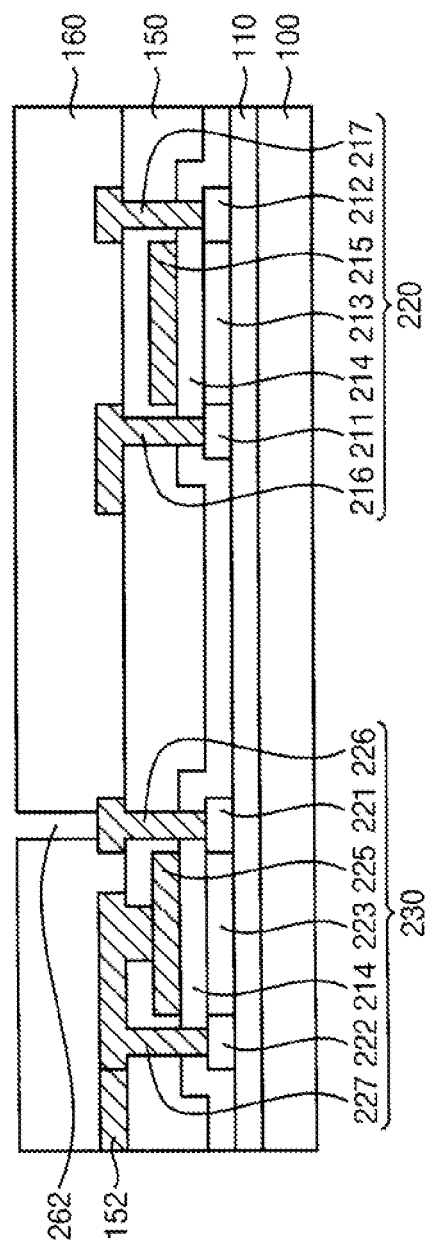

Referring to FIG. 8D, at least one insulation layer 160 covering the transistor 220 and 230 may be formed on the base substrate 100. The insulation layer 160 may be formed of a transparent material, such as transparent plastic, a transparent resin, etc. The insulation layer 160 may be formed by a spin coating method, a printing method, a vacuum deposition, etc. In an exemplary embodiment of the present invention, the insulation layer 160 may be planarized by a CMP method, an etch-back method, etc. In an exemplary embodiment of the present invention, the insulation layer 160 may be formed of a material having a self planarizing property. Therefore, the insulation layer 160 may have a flat surface. In an exemplary embodiment of the present invention, a first contact hole exposing a portion of the second source electrode 226 may be formed by partially etching the insulation layer 160. For example, the first contact hole 262 may be formed by photolithography.

Figure 8E:
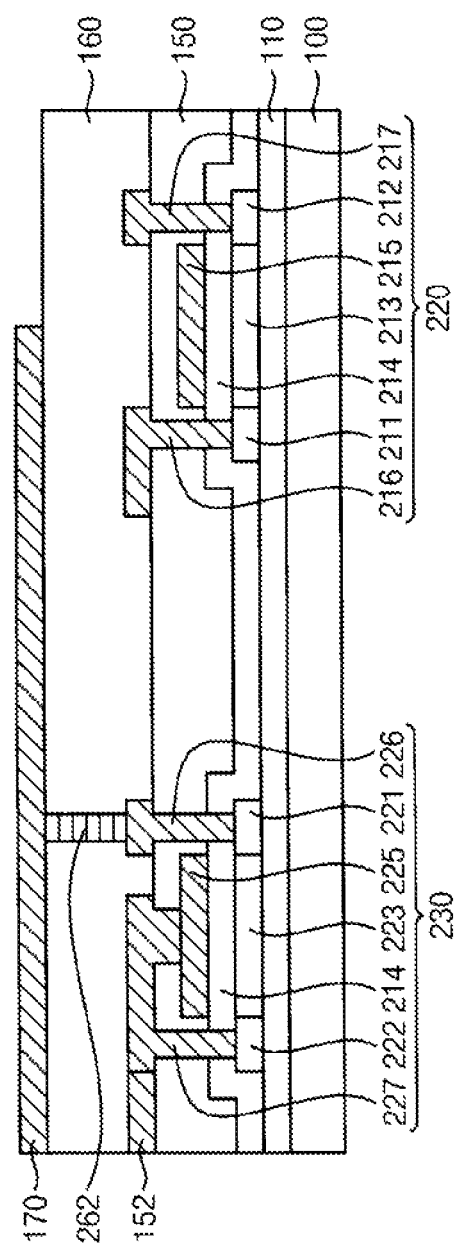

Referring to FIG. 8E, after forming a conductive layer filling the first contact hole 262, on the insulation layer 160, a first electrode 170 may be formed by patterning the conductive layer. Thus, the first electrode 170 may be directly connected to the second source electrode 226 through the first contact hole 262. The conductive layer may be formed by a sputtering method, a printing method, a spray method, CVD, ALD, vacuum deposition, PLD, etc, on the insulation layer 160. The first electrode 170 may be formed of a metal, an alloy, a transparent conductive material, etc. The first electrode 170 may be a reflective electrode, a transmitting electrode or a transflective electrode according to the type thereof. In an exemplary embodiment of the present invention, the first electrode 170 may be directly connected to the second source electrode 226 through the first contact hole 262. In an exemplary embodiment of the present invention, after forming a contact, a plug, a pad, etc filling the first contact hole 262, the first electrode 170 may be formed on the insulation layer 160. In an exemplary embodiment of the present invention, the first electrode 170 may be electrically connected to the second source electrode 226 by the contact, plug, pad, etc.

Figure 8F:
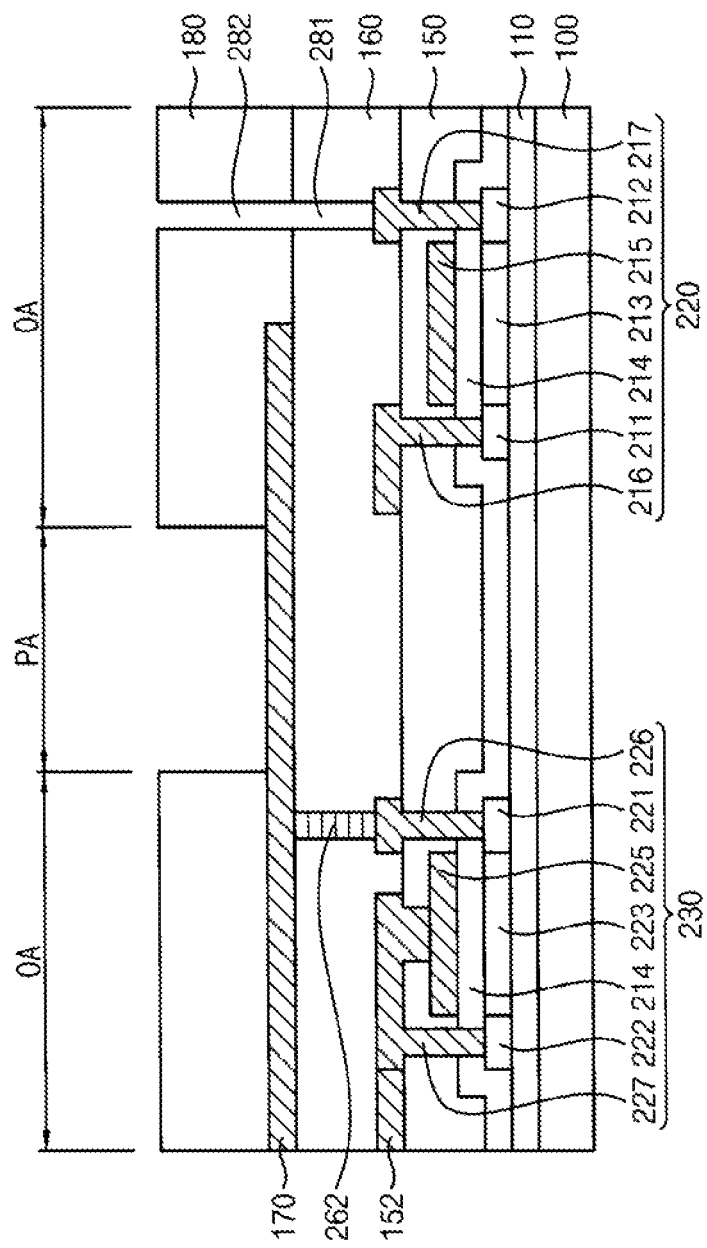

Referring to FIG. 8F, the pixel definition layer 180 covering the first electrode 170 may be formed on the insulation layer 160. The pixel definition layer 180 may include an opening exposing a portion of the first electrode 170. An organic layer 172 may be formed in the opening, and the first electrode 170, the organic layer 172 and the second electrode 190 constitute a pixel. The pixel definition layer 180 may be formed by a spin coating method, a printing method, a vacuum deposition, etc. The pixel definition layer 180 may be formed of an insulating material such as commercial polymer (e.g. poly methyl methacrylate, polystyrene), a polymer derivative having phenol group, an acryl-based polymer, an imid-based polymer, an aryl-ether-based polymer, an amide-based polymer, a fluorine-based polymer, a p-xylene-based polymer, a vinyl-alcohol-based polymer, etc, and a mixture thereof. A third contact hole 282 and a second contact hole 281 exposing a portion of the first drain electrode 217 may be formed in the pixel definition layer 180 and the insulation layer 160. For example, the third contact hole 282 and the second contact hole 281 may be formed by photolithography.

Referring to FIG. 8G, the organic layer 172 may cover the first electrode exposed by the opening in the pixel definition layer 180, and the organic layer 172 may cover a portion of the pixel definition layer 180, in non-pixel area OA. The organic layer 172 may be formed by stacking a hole injection layer, a hole transport layer, a light emitting layer, a electron transport layer and a electron injection layer. The organic layer 172 may be formed by deposition, mask sputtering, a photoresist method, a printing method, an inkjet method, etc. The deposition includes sputtering, CVD, PLD, vacuum deposition, ALD, etc. For example, the organic layer 172 may be formed by the mask sputtering including arraying a mask to expose a portion of the first electrode 170 and directly depositing a raw material on the first electrode 170 through the opening of the mask by heating and sputtering. The contact holes 282 and 281 are covered by the mask, preventing dust or chemical agents from entering the third contact hole 282 and the second contact hole 281.

After forming a conductive layer to cover the organic layer 172 and the pixel definition layer 180, the second electrode 190 may be formed by patterning the conductive layer. The second electrode 190 may be formed by sputtering, a printing method, a spray method, CVD, ALD, vacuum deposition, PLD, etc, and may be formed of a metal, an alloy, a transparent conductive material, etc. The second electrode 190 may be a reflective electrode, a transmitting electrode or a transflective electrode according to the type thereof. In an exemplary embodiment of the present invention, the second electrode 190 may be directly connected to the first drain electrode 217 through the third contact hole 282 and the second contact hole 281. In an exemplary embodiment of the present invention, after forming a contact, a plug, a pad, etc to fill the third contact hole 282 and the second contact hole 281, the second electrode 190 may be formed on the pixel definition layer 180. In an exemplary embodiment of the present invention, the second electrode 190 may be electrically connected to the first drain electrode 217 by the contact, plug, pad, etc.

Figure 8H:
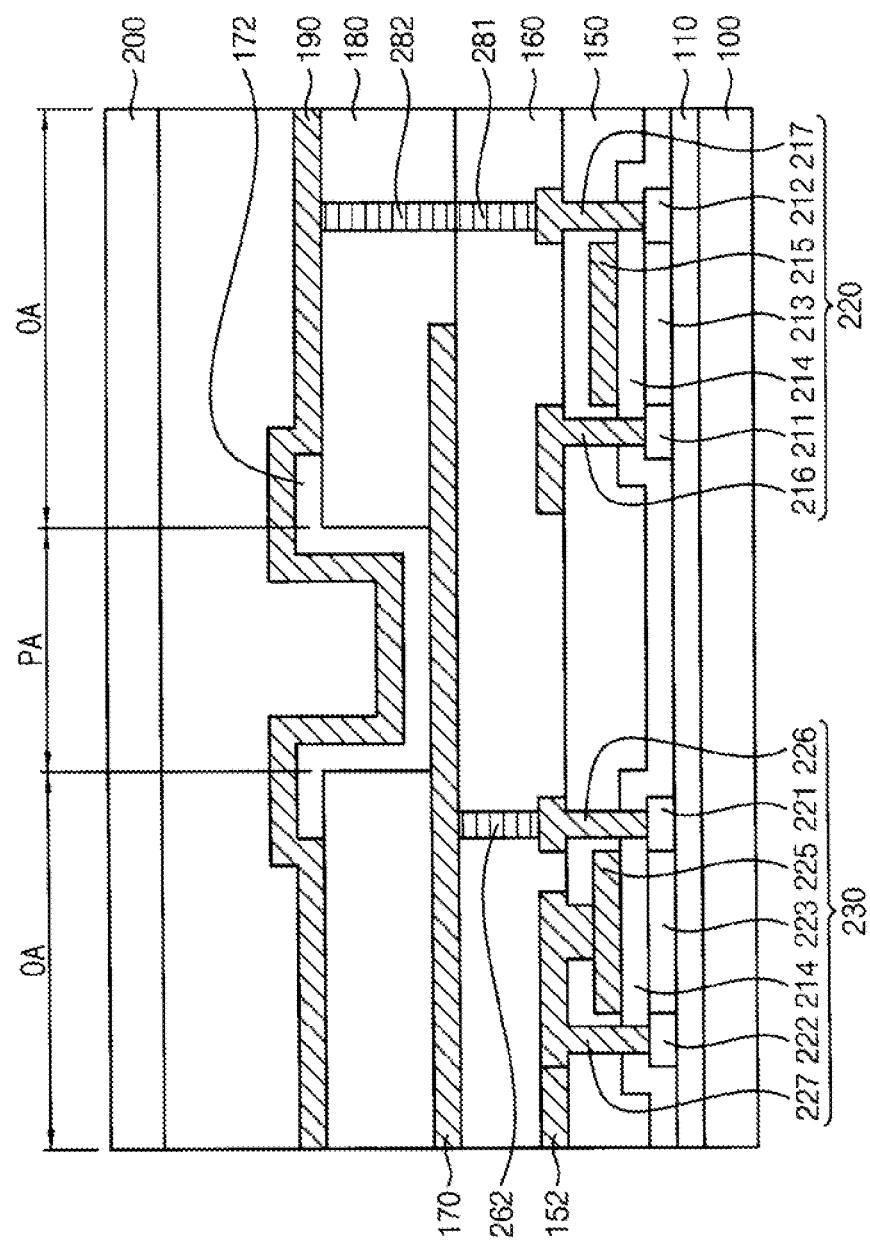

Referring to FIG. 8H, the organic light emitting display may be formed by encapsulating the transistor 220 and 230, the insulation layer 160, the first electrode 170, the organic layer 172, the second electrode 190 and the pixel definition layer 180 from an external environment, using a protective substrate 200. The encapsulation is achieved by bonding the protective substrate 200 disposed on the second electrode 190 to the base substrate 100, using a sealing material. The protective substrate 200 may include glass, a transparent metal film, an organic insulation layer, an inorganic insulation layer, etc. The encapsulation may be achieved by a hardening process using laser or ultraviolet. In an exemplary embodiment of the present invention, the protective substrate 200 may be bonded to the base substrate 100 with a space provided between the protective substrate 200 and the second electrode 190. In an exemplary embodiment of the present invention, the protective substrate 200 may be bonded to the base substrate 100 without a space between the protective substrate 200 and the second electrode 190.

According to a method of manufacturing an organic light emitting display in accordance with an exemplary embodiment of the present invention, the organic light emitting diode may be disposed between the switching device and driving device, and the array of the organic light emitting diodes can be changed easily. Thus, a lot of pixels may be disposed more compactly in a limited area. Therefore, the organic light emitting display having a high resolution is formed.

Figure 9:
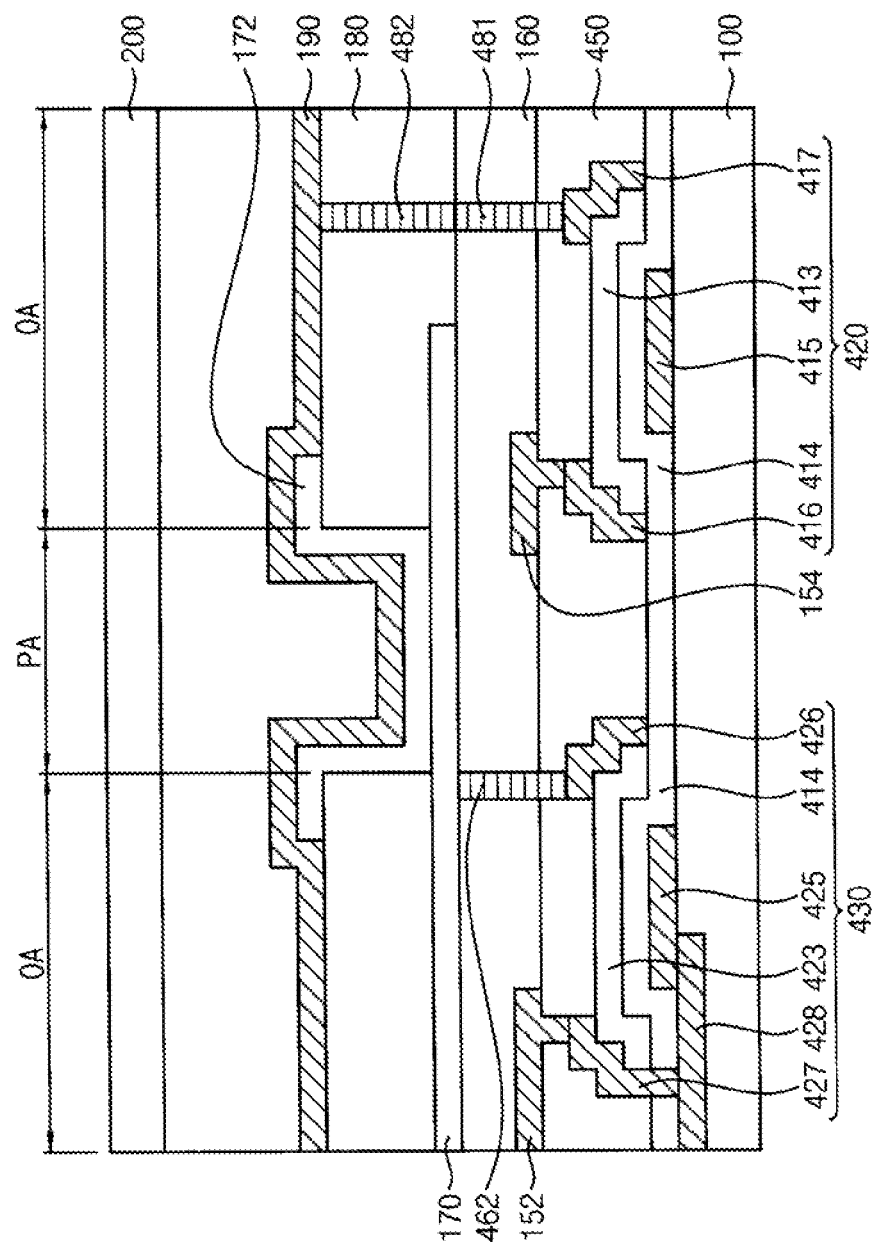
FIG. 9 is a cross sectional view illustrating an organic light emitting display in accordance with an exemplary embodiment of the present invention.

FIG. 9 is a cross sectional view illustrating an organic light emitting display in accordance with an exemplary embodiment of the present invention. FIGS. 10A to 10G are cross sectional views illustrating a method of manufacturing an organic light emitting display of FIG. 9, according to an exemplary embodiment of the present invention.

Referring to FIG. 9, an organic light emitting display includes a base substrate 100, a first transistor 420, a second transistor 430 a insulation layer 160 having a first contact hole 462 and a second contact hole 481, a pixel definition layer 180 having a third contact hole 482, an organic layer having a light emitting layer, a second electrode 190 and a protective substrate 200. In an exemplary embodiment of the present invention, the other elements than the first transistor 420, the second transistor 430, the first contact hole 462, the second contact hole 481 and the third contact hole 482 are substantially the same as their corresponding elements of the organic light emitting display described above in connection with FIGS. 5 and 6.

The first transistor 420 may be disposed on the base substrate 100, and may include a first gate electrode 415, a first source electrode 416, a first drain electrode 417 a gate insulation layer 414 and a first semiconductor layer 413. The first gate electrode 415 may be disposed on the base substrate 100, and the gate insulation layer 414 covering the first gate electrode 415 may be disposed on the base substrate 100. The first semiconductor layer 413 covering an area in which the first gate electrode 415 is located may be disposed on the gate insulation layer 414. As illustrated in FIG. 9, in an exemplary embodiment of the present invention, each of the first source electrode 416 and the first drain electrode 417 may be electrically connected to portions of the first semiconductor layer 413. In an exemplary embodiment of the present invention, each of the first source electrode 416 and the first drain electrode 417 may be electrically connected to the portions of the first semiconductor layer 413 through contacts disposed on the first semiconductor layer 413. In an exemplary embodiment of the present invention, as the contacts have high conductivity, the first source and drain electrode 416 and 417 are connected to the first semiconductor layer 413 as ohmic contacts. For example, the contacts may include amorphous silicon doped with phosphorus. The first drain electrode 417 may be electrically connected to the second electrode 190 through the second contact hole 481 and the third contact hole 482, and the first source electrode 416 may be electrically connected to a reference voltage member 154. The other elements of the first transistor 420 are substantially the same as their corresponding elements of the first transistor 220 of the organic light emitting display described above in connection with FIGS. 5 and 6.

The second transistor 430 may be disposed on the base substrate 100, and may include a second gate electrode 425, a second source electrode 426, a second drain electrode 427, the gate insulation layer 414 and a second semiconductor layer 413. As illustrated in FIG. 9, the second gate electrode 425 may be disposed on the base substrate 100, and the auxiliary electrode 428 electrically connected to the second gate electrode 425 may also be disposed on the base substrate 100. The gate insulation layer 414 covering the second gate electrode 425 may be disposed on the base substrate 100. The second semiconductor layer 423 covering an area in which the second gate electrode 425 is located may be disposed on the gate insulation layer 414. As illustrated in FIG. 9, in an exemplary embodiment of the present invention, each of the second source electrode 426 and the second drain electrode 427 may be electrically connected to portions of the second semiconductor layer 423. In an exemplary embodiment of the present invention, each of the second source electrode 426 and the second drain electrode 427 may be electrically connected to the portions of the second semiconductor layer 423 through contacts disposed on the second semiconductor layer 423. The contacts are substantially the same as the contacts in the first transistor 420. The second source electrode 426 may be electrically connected to the first electrode 170 through the first contact hole 462. The second drain electrode 427 may be electrically connected to the auxiliary electrode 428 through the gate insulation 414 and the second drain electrode 427 may also be electrically connected to a driving member 152. All of the elements of the second transistor 430 are substantially the same as their corresponding elements of the second transistor 230 of the organic light emitting display described above in connection with in FIGS. 5 and 6.

Referring to FIGS. 10A to 10G, a method of manufacturing an organic light emitting display is described hereinafter. According to an exemplary embodiment of the present invention, the other manufacturing steps than forming the first transistor 420 and the second transistor 430 are substantially the same as their corresponding manufacturing steps of the organic light emitting display described above in connection with FIGS. 8A to 8H.

Figure 10A:
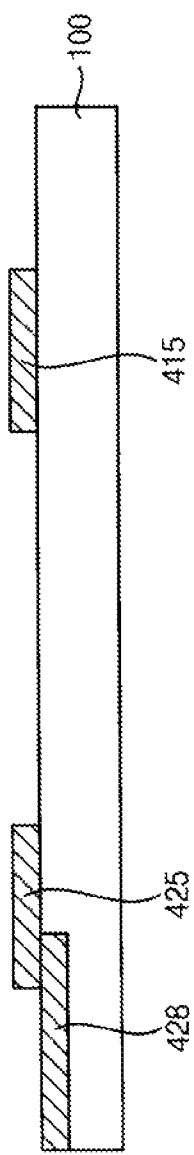

Referring to FIG. 10A, the gate electrode 415 and 425 and the auxiliary electrode 428 may be formed on the base substrate 100. The gate electrode 415 and 425 may be formed of a metal, a metal nitride, a conductive metal oxide, a transparent conductive material, etc, and may be formed by a sputtering method, CVD, ALD, a spin coating method, vacuum deposition, pulsed laser deposition (PLD), a printing method, etc. For example, a conductive multilayer may be formed by sequentially stacking a titanium layer, an aluminum layer and a titanium layer, and the conductive layer may be formed on the base substrate 100, and the first gate electrode 415, a second gate electrode 425, the auxiliary electrode 428 and a gate line may be formed by patterning process using photolithography. The patterned portions of the conductive multilayer structure may be removed by reactive ion etching (RIE) using gases having chlorine.

Figure 10B:
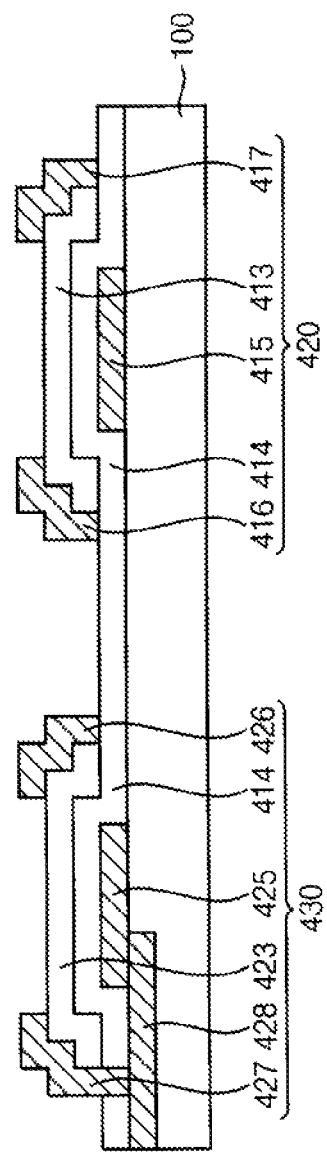

Referring to FIG. 10B, the gate insulation layer 414 covering the gate electrode 415 and 425 and auxiliary electrode 428 may be formed on the base substrate 100. The gate insulation layer 414 may be formed by substantially the same method as the method of forming the gate insulation layer 214 described above in connection with FIG. 8B.

The semiconductor layer 413 and 423 covering areas in which the gate electrodes 415 and 416 are located may be formed on the gate insulation layer 414. The semiconductor layer 413 and 423 may be formed of polysilicon, amorphous silicon, a oxide semiconductor having metal oxides, poly silicon having impurities, amorphous silicon having impurities, etc. For example, the semiconductor layer 413 and 423 may be formed by a procedure including depositing an oxide semiconductor layer having zinc oxide (ZnO) on the gate insulation layer 414, and patterning the oxide semiconductor layer by photolithography after deposition, and wet etching the oxide semiconductor layer by an oxalic acid. Upon patterning, a hole exposing a portion of auxiliary electrode 428 may also be patterned.

After forming the semiconductor layers 413 and 423, a conductive layer covering the semiconductor layers 413 and 423 may be formed, and the source electrodes 416 and 426 and the drain electrodes 417 and 427 may be formed by using source and drain masks. In an exemplary embodiment of the present invention, the second drain electrode 427 may be connected to the auxiliary electrode 428 through the hole formed in the gate insulation layer 414. The source electrodes 416 and 426 and the drain electrodes 417 and 427 may be formed by substantially the same method as the method of forming the source electrodes 216 and 226 and the drain electrodes 217 and 227 as described above in connection with FIG. 8C.

Figure 10C:
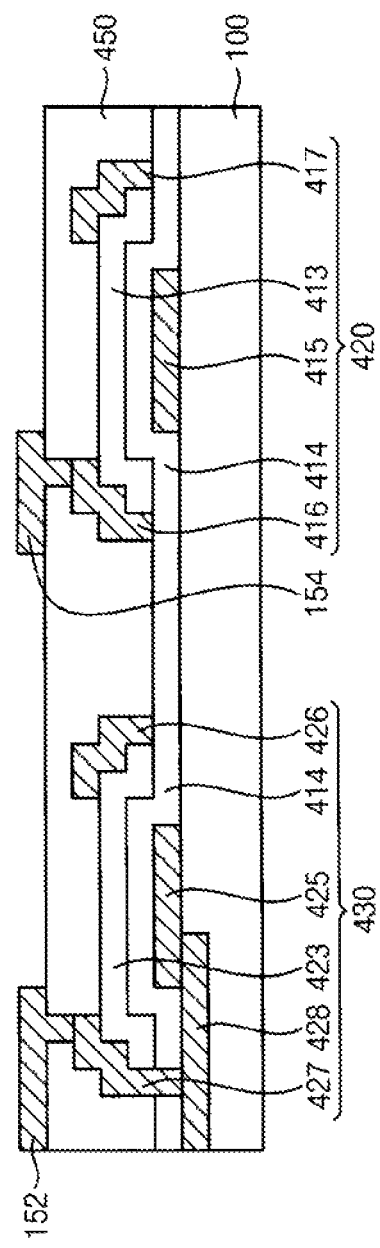

Referring to FIG. 10C, the insulating interlayer 450 covering the semiconductor layers 413 and 423, the source electrodes 416 and 426 and the drain electrodes 417 and 427 may be formed. The insulating interlayer 450 may be formed by substantially the same method as the method of forming the insulating interlayer 150 described above in connection with FIG. 8C.

Holes exposing a portion of the first source electrode 416 and a portion of the second drain electrode 427 may be formed in the insulating interlayer 450. Thereafter, a conductive layer may fill the holes in the insulating interlayer 450, and a driving member 152 electrically connected to the second drain electrode 427 and a reference voltage member 154 electrically connected to the first source electrode 416 may be formed by photolithography and an etching process to pattern the conductive layer. Each of the driving member 152 and reference voltage member 154 may be formed of a metal, a metal nitride, a conductive metal oxide, a transparent conductive material, etc, and may be formed by a sputtering method, CVD, PECVD, ALD, a spin coating method, vacuum deposition, PLD, a printing method, etc.

Figure 10D:
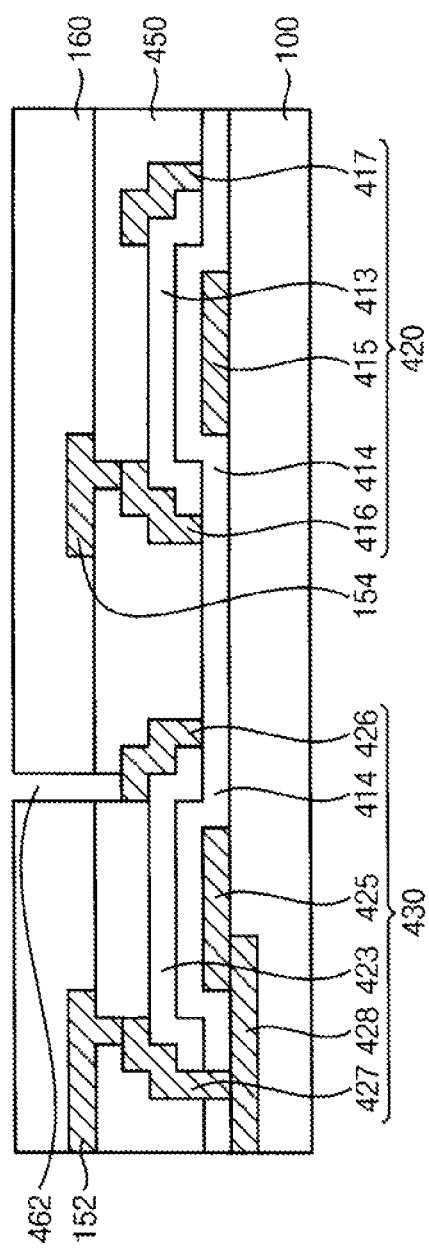

Referring to FIG. 10D, the insulation layer 160 covering the driving member 152, the reference voltage member 154 and insulating interlayer 450 may be formed. The insulation layer 160 may be formed by substantially the same method as the method of forming the insulation layer 160 described above in connection with FIG. 8D.

The first contact hole 462 exposing a portion of the second source electrode 426 may be formed in the insulation layer 160. For example, the first contact hole 462 may be formed by photolithography.

Referring to FIG. 10E, a conductive layer fills the first contact hole 462 in the insulation layer 160, and the first electrode 170 may be formed by patterning the conductive layer. The first electrode 170 may be electrically connected to the second source electrode 426 through the first contact hole 462. The first electrode 170 may be formed by substantially the same method as the method of forming the first electrode 170 described above in connection with FIG. 8E.

Referring to FIG. 10F, the pixel definition layer 180 covering the first electrode 170 and the insulation layer 160 may be formed on the first electrode 170. Thereafter, an opening may be formed in the pixel definition layer 180, and the third contact hole 482 may be formed in the pixel definition layer 180, and the second contact hole 481 connected to the third contact hole 482 by penetrating the insulation layer 160 may also be formed. The pixel definition layer 180, the third contact hole 482 and the second contact hole 481 may be formed by substantially the same method as the method of forming the pixel definition layer 180, the third contact hole 282 and the second contact hole 281 as described above in connection with FIG. 8F.

A portion of the first electrode 170 is exposed by the opening formed in the pixel definition layer 180, and the organic layer 172 may be formed in the area e.g., the pixel area, exposing the portion of the first electrode 170. The organic layer 172 may be formed by substantially the same method as the method of forming the organic layer 172 as described above in connection with FIG. 8G.

Referring to FIG. 10G, a conductive layer may cover the organic layer 172 and the conductive layer may fill the third contact hole 482 and the second contact hole 481. Thereafter, the second electrode 190 may be formed by patterning the conductive layer. The second electrode 190 may be formed by substantially the same method as the method of forming the second electrode 190 described above in connection with FIG. 8G.

The organic light emitting display may be formed by encapsulating the transistors 420 and 430 from an external environment, using a protective substrate 200. The encapsulation is achieved by substantially the same method as the method of the encapsulation using the protective substrate 200 and the sealing material, as described above in connection with FIG. 8H.

According to a method of manufacturing an organic light emitting display in accordance with an exemplary embodiment, various layouts of the organic light emitting diode may be obtained, and an integrated circuit layout may also be obtained by the efficient use of a space. Thus, an organic light display having a high resolution may be provided.

Exemplary embodiments of the present inventive concept may apply to a display having an organic light emitting diode. Although the exemplary embodiments of the present invention use, by way of example, teach top emission type organic light emitting displays, the present inventive concept may apply to bottom emission type organic light emitting displays or double-side emission type organic light emitting displays as well. For example, the present inventive concept may apply to any type of organic light emitting display including the second electrode connected to some devices through the contact hole in pixel definition layer. For example, the present inventive concept may be applied to an organic light emitting display having red, green and blue sub-pixels or a white light emitting organic display. The organic light emitting display in accordance with an exemplary embodiment of the present invention may be used in a monitor, a television, a desktop computer, a laptop computer, a PDA (Personal Digital Assistant), a cellular phone, a GPS navigator, etc.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. An organic light emitting display, comprising:
a base substrate;
a first transistor disposed in a first portion on the base substrate, the first transistor including a first gate electrode, a first source electrode, and a first drain electrode;
a second transistor disposed in a second portion that is spaced apart from the first portion on the base substrate, the second transistor including a second source electrode, a second gate electrode, and a second drain electrode;
an insulation layer including a first contact hole and a second contact hole, the insulation layer covering the first and second transistors on the base substrate;
a first electrode electrically connected to the second transistor through the first contact hole;
a pixel definition layer having a third contact hole, the pixel definition layer having a pixel area and an non-pixel area surrounding the pixel area, the pixel definition layer being disposed on the first electrode;
an organic layer including a light emitting layer, the organic layer being disposed on the pixel area of the first electrode; and
a second electrode facing the first electrode, the second electrode being electrically connected to the first transistor through the third contact hole and the second contact hole, the second electrode being disposed on the organic layer and the pixel definition layer,
wherein the third contact hole and the second contact hole are connected to each other; wherein the second drain electrode is electrically connected to the second gate electrode.

2. The organic light emitting display of claim 1, wherein each of the first transistor and the second transistor comprises a P-type transistor.

3. The organic light emitting display of claim 1, wherein the organic layer is located on a region between the first and second transistors.

* * * * *